United States Patent [19]

Dziura et al.

[11] Patent Number: 4,884,164
[45] Date of Patent: Nov. 28, 1989

[54] MOLDED CASE ELECTRONIC CIRCUIT INTERRUPTER

[75] Inventors: Richard A. Dziura; Ronald R. Russell, both of Plainville; Graham A. Scott, Avon, all of Conn.

[73] Assignee: General Electric Company, New York, N.Y.

[21] Appl. No.: 305,341

[22] Filed: Feb. 1, 1989

[51] Int. Cl.$^4$ .............................. H02M 3/053
[52] U.S. Cl. ...................................... 361/97
[58] Field of Search .................. 361/93–98, 361/102; 335/18, 21, 202

[56] References Cited

U.S. PATENT DOCUMENTS

| | | | |
|---|---|---|---|
| 3,693,122 | 9/1972 | Willard | 335/174 |
| 4,589,052 | 5/1986 | Dougherty | 361/94 |
| 4,672,501 | 6/1987 | Bilac et al. | 361/96 |
| 4,679,019 | 7/1987 | Todaro et al. | 335/172 |
| 4,689,710 | 8/1987 | Anzai | 361/93 |
| 4,728,914 | 3/1988 | Morris et al. | 335/6 |
| 4,741,002 | 4/1988 | Dougherty | 377/49 |
| 4,754,247 | 6/1988 | Raymont et al. | 335/202 |
| 4,757,294 | 7/1988 | Todaro et al. | 335/202 |
| 4,788,621 | 11/1988 | Russell et al. | 361/115 |

*Primary Examiner*—Derek S. Jennings
*Attorney, Agent, or Firm*—Richard A. Menelly; Walter C. Bernkopf; Fred Jacob

[57] ABSTRACT

An electronic trip unit within a self-contained circuit interrupter utilizes dual electromagnetic trip actuators. One such actuator responds to overcurrent conditions to interrupt the protected circuit up to a predetermined value. The other such actuator interrupts the protected circuit at all overcurrent conditions in excess of the predetermined value.

23 Claims, 7 Drawing Sheets

MOLDED CASE ELECTRONIC CIRCUIT INTERRUPTER

BACKGROUND OF THE INVENTION

Electronic circuit interruption devices are supplementing thermal and magnetic circuit breakers in many industrial applications. The electronic circuit interrupter includes a signal processing circuit in the form of a printed wire board contained within the circuit interrupter enclosure. The arrangement of the circuit interrupter enclosure provides for selection of various electrical accessories that are field-installed. U.S. Pat. Nos. 4,754,247; 4,757,294 and 4,788,621 describe such electronic circuit interrupters along with the trip actuator module that responds to the electronic trip circuit to separate the circuit interrupter contacts. U.S. Pat. Nos. 4,589,052 and 4,741,002 describe electronic trip circuits used to provide the trip signal to the trip actuator module. U.S. Pat. No. 4,679,019 describes a trip actuator module in the form of an electromagnetic trip actuator which includes mechanical linkage for interfacing with the circuit interrupter operating mechanism to separate the circuit interrupter contacts. All of the aforementioned U.S. patents are incorporated herein for reference purposes.

The electromagnetic trip actuator described within the aforementioned U.S. Pat. No. 4,679,019 is designed for operation within electronic circuit interrupters rated at 600 amperes or less. With industrial circuit interrupters rupters rated at more than 600 amperes, the circuit interruption mechanism and corresponding circuit interrupter contacts are sized to provide continuous current transfer at the higher ampere rating without becoming overheated. The compact size of the electromagnetic trip actuator limits the amount of motive-force applied to the circuit interrupter operating mechanism such that the electromagnetic trip actuator, per se, is incapable of articulating the larger size operating mechanisms.

One purpose of the instant invention, is to provide dual trip actuators and electronic control circuits that are capable of operation over a wide range of circuit interrupter ampere ratings.

SUMMARY OF THE INVENTION

A molded case electronic circuit interrupter includes an electronic trip unit for operating a first electromagnetic trip actuator to separate the circuit interrupter contacts over a predetermined range of overcurrent conditions. A supplemental electromagnetic trip actuator and a separate electronic control circuit separates the circuit interrupter contacts at higher overcurrent conditions. The supplemental electromagnetic trip actuator is supplied with operating power from the electrical distribution circuit through current transformers.

DESCRIPTION OF THE PREFERRED EMBODIMENT

Figure 1:
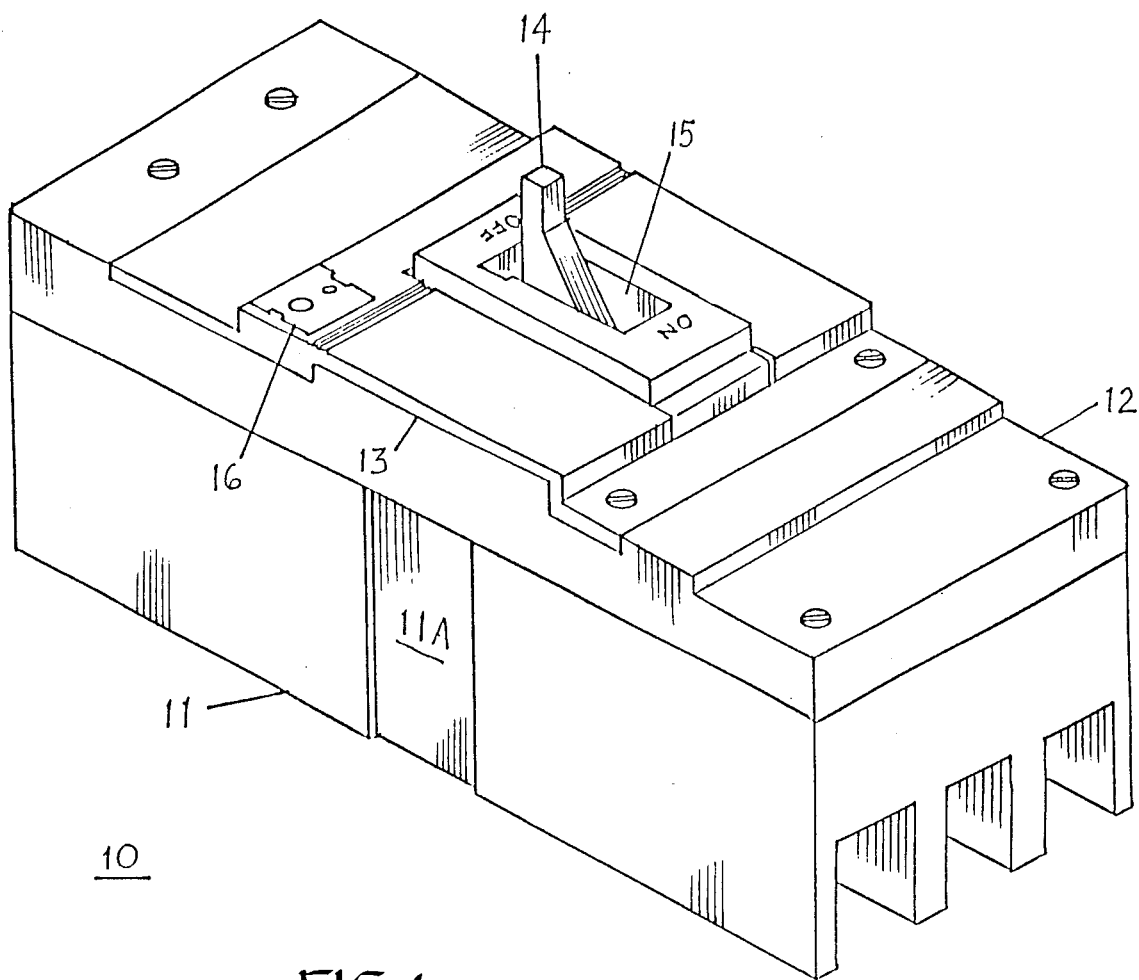
FIG. 1 is a top view of an electronic circuit interrupter containing the dual electromagnetic trip actuator units in accordance with the invention.

An electronic trip circuit breaker 10 is depicted in FIG. 1 wherein the circuit breaker case 11 containing the circuit breaker components is sealed by means of a circuit breaker cover 12 and an accessory cover 13. The circuit breaker is switched ON and OFF by means of a handle operator 14 which projects through the handle slot 15 formed within the circuit breaker cover 12. An externally-accessible rating plug 16 fits within the accessory cover for setting the circuit breaker ampere rating. A wiring access slot 11A formed in the side of the case provides for the egress of electrical wire conductors for internally accessing the circuit breaker accessories contained therein.

Figure 2:
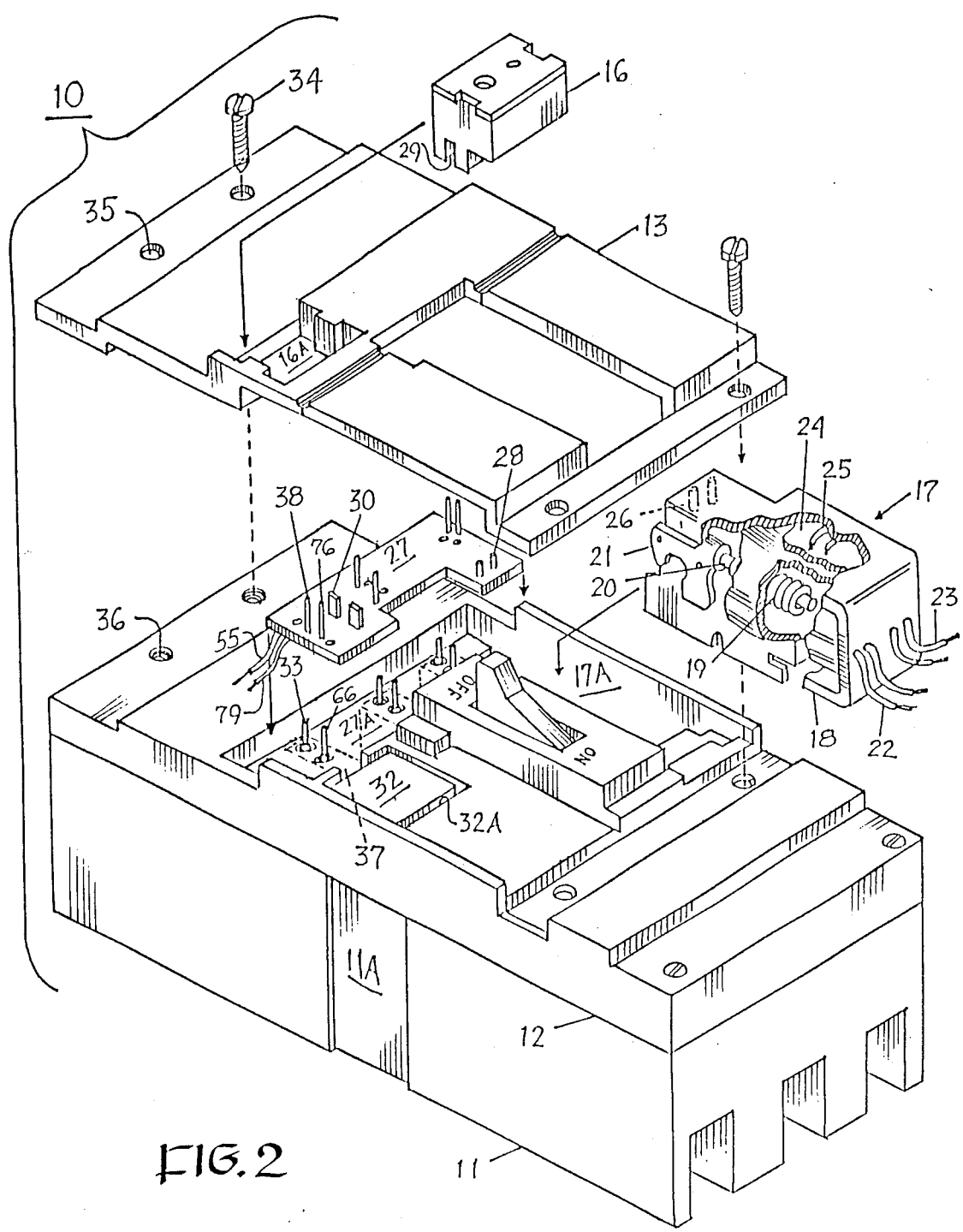
FIG. 2 is a top perspective view of the electronic circuit interrupter of FIG. 1 with one of the electromagnetic trip actuators of the invention shown in isometric projection.

The electronic circuit breaker 10 is depicted in FIG. 2 with the current transformers 37 already assembled within the circuit breaker case 11 such that the Three such transformers are employed, one for each separate phase of the electrical distribution circuit to which the electronic circuit interrupter is connected. The auxiliary switch 32 is depicted within the auxiliary switch recess 32A prior to insertion of the actuator-accessory unit 17 within the actuator access 17A and the insertion of the printed wire board 27 within the printed wire board recess 27A. When these components are inserted within the respective recesses within the cover 12, the accessory cover 13 is attached by means of screws 34, thru-holes 35 and threaded openings 36 at which time the rating plug 16 is next inserted within the rating plug recess 16A to complete the electronic circuit interrupter assembly. The printed wire board 27 contains an electronic trip circuit such as that described within aforementioned U.S. Pat. No. 4,741,002. The printed wire board electrically connects with the current transformers 37 by attachment between the pins 38, 76 upstanding on the printed wire board and the transformer pin connectors 33, 66. When the printed wire board is electrically connected with the current transformers, the actuator-accessory unit 17 is positioned over a part of the printed wire board such that the printed wire board pins 28 are received within the connector sockets 26 that are formed within the undervoltage release and shunt trip printed wire board 24 situated within the housing 18. The actuator-accessory unit is described within aforementioned U.S. Pat. No. 4,788,621. A good description of the undervoltage and shunt trip circuit is found within U.S. patent application Ser. No. 176,589 filed Apr. 1, 1988, which Application is incorporated herein for reference purposes. The rating plug 16 connects with the printed wire board 27 by positioning the connectors 29 formed on the bottom of the rating plug over the pins 30 upstanding from the printed wire board. The rating plug is described within U.S. Pat. No. 4,728,914, which Patent is incorporated herein for purposes of reference. As further described in aforementioned U.S. Pat. No. 4,788,621, the actuator-accessory unit includes an actuator-accessory electromagnetic coil 19 hereafter "actuator-accessory coil" that interacts with a plunger 20 to control the operation of the actuator lever 21 to electrically disconnect the circuit breaker upon internal signals generated by the printed wire board 27 as well as by external signals supplied to the undervoltage and shunt trip printed wire board 24. The actuator-accessory unit connects with a remote voltage source by means of conductors 22 to provide undervoltage release facility and with a remote switch by means of conductors 23 to provide shunt trip facility to the actuator-accessory unit. The actuator-accessory coil 19 electrically connects with the undervoltage and shunt trip printed wire board 24 over conductors 25. The printed wire board 27 connects with an additional trip actuator printed wire board 54 by means of conductors 55, 79 best seen by referring now to FIG. 3 wherein the circuit breaker case 11 is depicted with the cover removed to show the positioning of the current transformers 37 within the three respective compartments 44–46. The additional trip actuator printed wire board is supported within compartment 46 by means of ledges 75. Also included within the case is a crossbar assembly 40 which carries the movable contact arms 41 and movable contacts 42 The position of the movable contacts with respect to corresponding fixed contacts 43 is controlled by the operating mechanism 39 by means of a trip bar 53. The trip bar is acted upon by operation of the accessory actuator unit 17 shown earlier in FIG. 2 along with an auxiliary trip actuator 47 within a U-shaped housing 48 which is positioned within the compartment 44. The auxiliary trip actuator is similar to that described within U.S. Pat. No. 3,693,122, which Patent is incorporated herein for reference purposes and should be reviewed for its description of a flux "diverter" which allows the plunger 50 to be rapidly propelled by the trip spring 51 when the auxiliary trip coil 49 is actuated by signals transmitted over the two-conductor cable 52. The three-conductor cables 71, 77 connect the trip actuator printed wire board 54 with the transformer pin connectors 33, 66.

Figure 3:
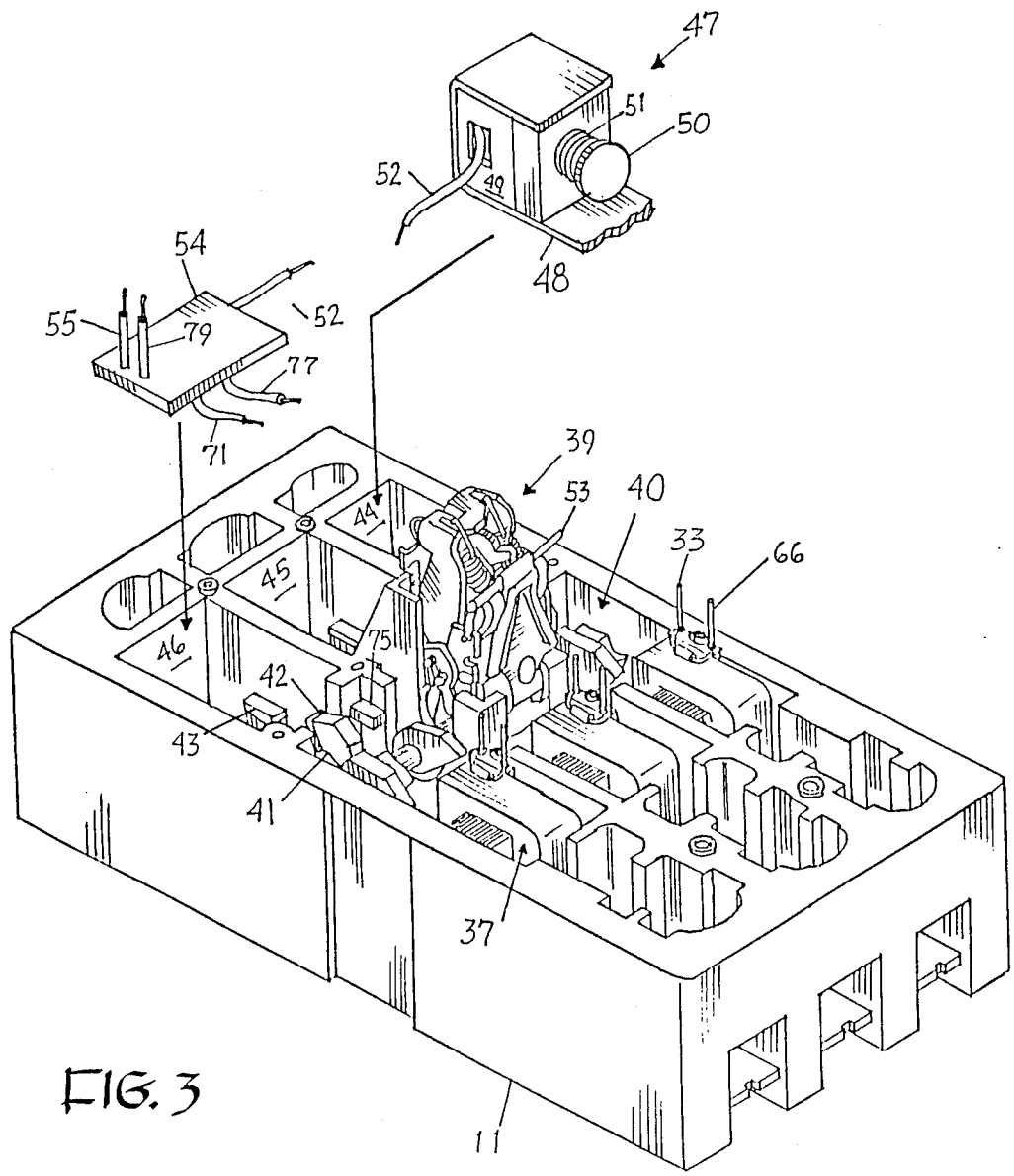
FIG. 3 is a top perspective view of the electronic circuit interrupter of FIGS. 1 and 2 with the cover removed and with the supplemental electromagnetic trip actuator and supplemental control circuit according to the invention depicted in isometric projection.
Figure 4:
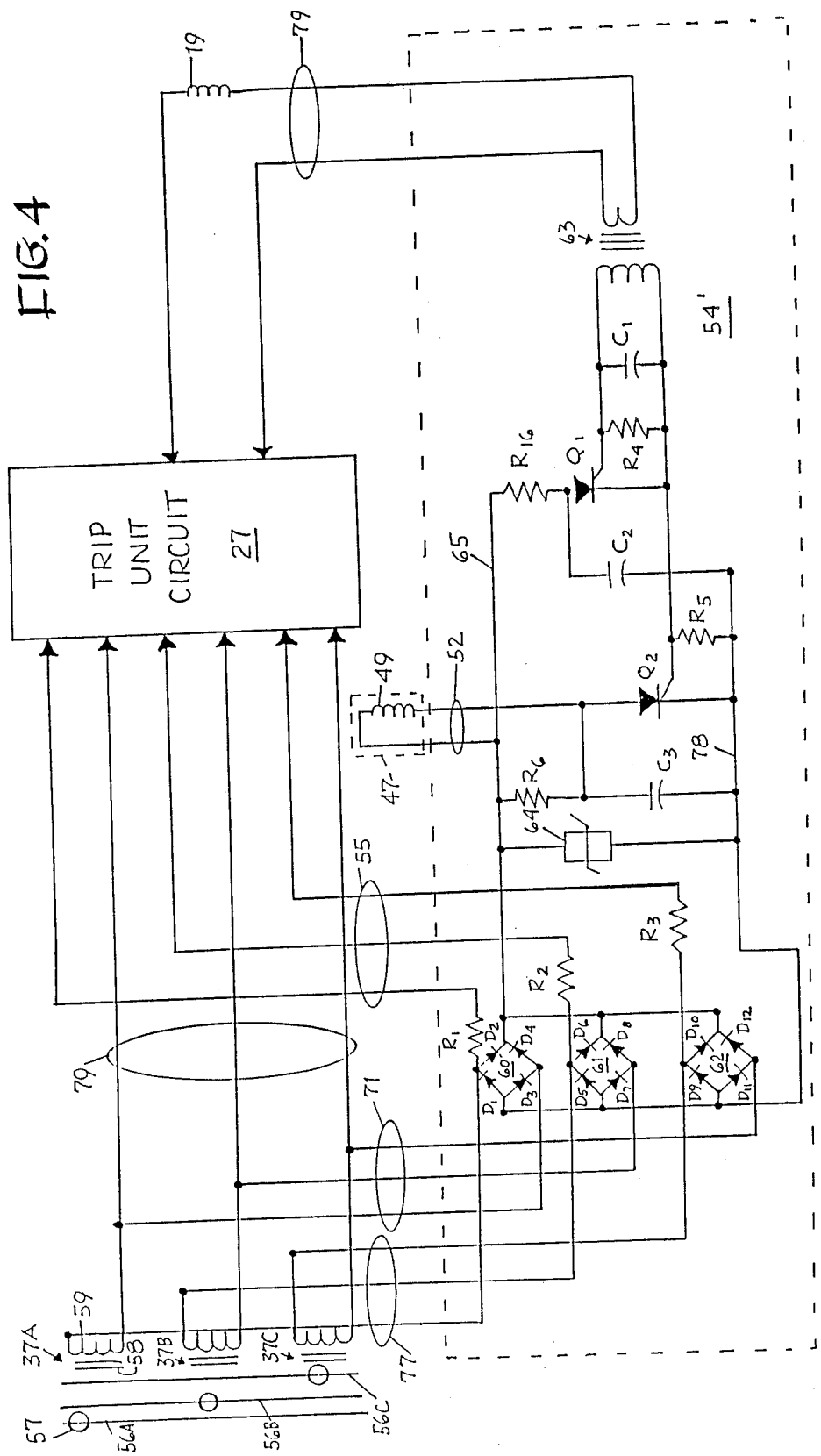
FIG. 4 is a schematic representation of the electronic circuits employed within the electronic circuit interrupter depicted in FIGS. 1-3.

The interaction between the trip unit printed wire board 27 of FIG. 2 and the trip actuator printed wire board 54 of FIG. 3 can be seen by referring now to FIGS. 4–7. The electronic circuit arrangement 80 in FIG. 4 denotes the connection between the external three-phase power conductors 56A–56C, the electronic trip unit circuit 27 and the trip actuator control circuit 54'. Three corresponding current transformers 37A–37C each interconnect with the trip unit circuit and the trip actuator control circuit by means of a primary winding 57, core 58 and secondary winding 59 for transformer 37A associated with power conductor 56A, for example. The secondary windings connect with the first inputs to three bridge rectifiers 60–62 consisting of diodes $D_1$–$D_{12}$ over the three-conductor cable 77 as indicated. The other inputs to the bridge rectifier are connected with the secondary windings by means of a separate three-conductor cable 71. The secondary windings also connect with the trip unit circuit by means of a separate three-conductor cable 79. The bridge rectifier first outputs connect with the trip unit circuit over a separate three-conductor cable 55 through current limiting resistors $R_1$–$R_3$. One output from the bridge rectifiers connects with the positive rail 65 of the trip actuator circuit 54' while the other output connects with the negative rail 78. Varistor 64 is connected across the positive and negative rails to clamp the voltage that occurs during a short circuit condition on the power conductors. The auxiliary trip coil 49 within the auxiliary trip actuator 47 is connected to the trip actuator printed wire board circuit 54' by means of the two-conductor cable 52. Electrical connection between the trip unit circuit 27 and the trip actuator circuit is made by means of the two-conductor cable 79 and the pulse transformer 63. Upon the occurrence of an overcurrent condition sensed within the trip unit circuit, the actuator-accessory coil 19 within the actuator-accessory unit 17 (FIG. 2) becomes energized which, in turn, generates a signal at the gate of a first thyristor $Q_1$ through pulse transformer 63, RF by-pass capacitor $C_1$ and resistor $R_4$. With $Q_1$ conductive, a gate signal is applied through $R_{16}$ to the gate of a second thyristor $Q_2$ thereby rendering $Q_2$ conductive and causing current to flow through the auxiliary trip coil 49. $R_6$ supplies latching current to insure that the second thyristor remains on while the current through the auxiliary trip coil continues to rise. The gate sensitivity of $Q_2$ is set by resistor $R_5$ connected between the gate of $Q_2$ and the negative rail 78. Capacitor $C_3$ limits the rate of rise of voltage across the second thyristor to prevent false triggering from transient voltages while capacitor $C_2$ limits the rate of rise of voltage occurring across the $Q_1$ to prevent false conduction by means of rapidly rising transient voltages. With $Q_2$ conductive, some of the current provided by the current transformers 37 becomes diverted from the trip unit circuit 27 and transferred to the trip actuator circuit 54' via cable conductors 71, 77 through the bridge rectifiers 60–62 over to the auxiliary trip coil 49. The proportion of current from the current transformers that flows through the auxiliary trip coil is determined by the ratio between the auxiliary trip coil impedance and the impedance of the trip unit circuit. The impedance for the trip unit circuit is mainly determined by the values of current limiting resistors $R_1$–$R_3$ which can vary from approximately 0 to 30 ohms. In operation, $Q_2$ becomes triggered at low levels of overcurrent conditions sensed within the trip unit circuit 27. At the low level overcurrent conditions however, the current that flows from the current transformers 37 is insufficient to cause the auxiliary trip coil 49 to release its associated plunger 50 to articulate the circuit breaker operating mechanism 39 (FIG. 3). At higher overcurrent conditions, above a predetermined value, the overcurrent levels are sufficient to release the plunger and thereby articulate the operating mechanism. In the electronics circuit arrangement 80 of FIG. 4, the thyristors $Q_1$, $Q_2$ are associated with the pulse transformer 63 in a "master"-"slave" arrangement whereby slave thyristor $Q_1$, for example, is smaller in size and rating than master thyristor $Q_2$ to minimize the energy required to trigger the thyristors from the pulse transformer 63. This in turn allows the pulse transformer to be of a smaller size and rating and hence require less energy for operation. It is to be clearly understood that a larger-rated pulse transformer can be directly connected with thyristor $Q_2$ and thyristor $Q_1$ could be eliminated, if so desired. In operation therefore, the current within the current transformers 37 is processed within the trip unit circuit 27 and an output signal is provided to the actuator-accessory coil 19 which is reflected via the trip actuator circuit 54' within the auxiliary trip coil 49. Until a predetermined overcurrent conditions occurs, there is insufficient current from the current trans-formers through the trip actuator coil to articulate the circuit breaker operating mechanism. Upon reaching the predetermined overcurrent condition, sufficient current flows from the current transformers through the auxiliary trip coil to thereby articulate the circuit breaker operating mechanism and separate the circuit breaker contacts (FIG. 3) to interrupt the circuit current. The use of the current transformers 37 to energize the auxiliary trip coil 49 is advantageous over the prior art use of storage capacitors as a source of energy. The use of such a storage capacitor is described, for example, in U.S. Pat. No. 4,672,501, which Patent is incorporated herein for reference purposes. Since the storage capacitors are generally rated at several hundred microfarads there is a substantial savings in space requirements when such capacitors are eliminated from the trip unit circuit.

Figure 5:
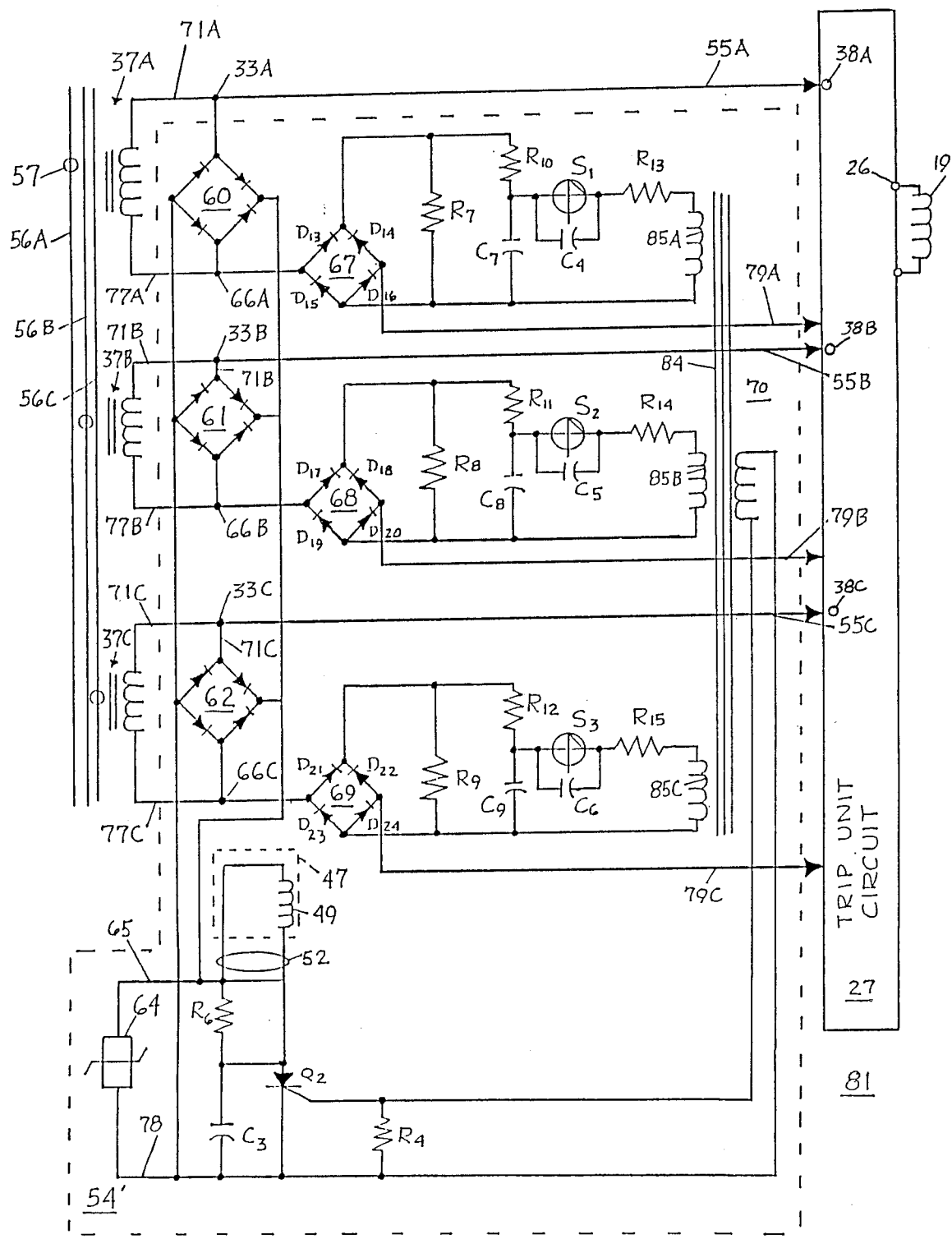
FIG. 5 is an alternative embodiment of the circuit shown in FIG. 4.

An alternate arrangement of the circuit electronics within the circuit breaker 10 of FIG. 1 is depicted at 81 in FIG. 5 wherein the current transformers 37A–37C are coupled with the respective power conductors 56A–56C by means of a primary winding as indicated at 57 for transformer 37 for example are connected with the trip actuator circuit 54′ by means of conductors 71A–71C and 77A–77C as illustrated. The transformer pins 33, 66 (FIG. 2) connect both with the trip unit circuit 27 by transformer pins 33A–33C, trip unit pins 38A–38C and conductors 55A–55C as well as with the trip actuator circuit 54′ by means of transformer pins 66A–66C and conductors 79A–79C respectively. The trip actuator circuit 54′ contains elements common to those described earlier with respect to FIG. 4 and common reference elements will be employed, where possible. The bridge rectifiers 60–62 serve to rectify the current received from the current transformers and supply power to the positive and negative rails 65, 78. The auxiliary trip coil 49 is located within the auxiliary trip actuator 47 separate from the trip actuator circuit 54′ and is connected therewith by means of the two-conductor cable 52. The varistor 64 is connected between the positive and negative rails in a manner, described earlier and the thyristor $Q_2$, resistors $R_4$, $R_6$ and capacitor $C_3$ function in the manner described earlier with respect to FIG. 4. The circuit differs from that of FIG. 4 in that the trip actuator coil 19 directly connects with the trip unit circuit 27 by means of the connectors 26 and serve to interrupt lower overcurrent conditions upon command signals originating within the trip unit circuit. The auxiliary trip coil 49 is again supplied directly from the current transformers upon triggering of the thyristor $Q_2$. $Q_2$ in turn is provided with gate current by means of a pulse transformer 70 which is coupled with three primary windings 85A–85C through a common core 84. The bridge rectifiers 60–62 connect with the transformer primary windings 85A–85C through second bridge rectifiers 67–69 and silicon switches $S_1$–$S_3$. The second bridge rectifiers comprise diodes $D_{13}$–$D_{24}$. The output of each of the second bridge rectifiers is connected to the silicon switches by means of respective burden resistors $R_7$–$R_9$. The burden resistors generate corresponding voltage signals in proportion to the current transferring through the current transformers. The value of the burden resistors $R_7$–$R_9$ is selected so that the respective capacitors $C_7$–$C_9$ will charge to a value in excess of the break-over threshold of the silicon switches $S_1$–$S_3$ causing the capacitors to discharge into the primary windings 85A–85C of the pulse transformer 70. Resistors $R_{10}$–$R_{12}$ provide an RC-timing network with capacitors $C_7$–$C_9$ to prevent break-over of the silicon switches upon the occurrence of spurious overcurrent conditions. The output of the pulse transformer is reflected at the gate of thyristor $Q_2$ causing the current from the current transformers 37 to flow through the auxiliary trip coil 49 and thereby articulate the circuit breaker operating mechanism 39, of FIG. 3. Resistors $R_{13}$–$R_{15}$ serve to limit the current through the respective silicon switches $S_1$–$S_3$ while capacitors $C_4$–$C_6$ provide RF by-pass in order to prevent the silicon switches from inadvertent break-over upon occurrence of voltage transients. This circuit differs from that described in FIG. 4 in that the trip unit circuit 27 governs the operation of the actuator-accessory coil 19 to articulate the operating mechanism for overcurrent conditions up to a predetermined value. When the overcurrent conditions exceed the predetermined value, the operating mechanism becomes articulated by operation of the auxiliary trip coil 49. The actuating current for the auxiliary trip coil is directly provided by the current transformers and allows the auxiliary trip coil to articulate the circuit breaker operating mechanism without the intervention of the trip unit circuit 27 and without requiring energy supplied by large storage capacitors. The pulse transformer 70 provides electrical isolation between the individual phases within the separate phase conductors 56A–56C by means of the separate primary windings 85A–85C.

Figure 6:
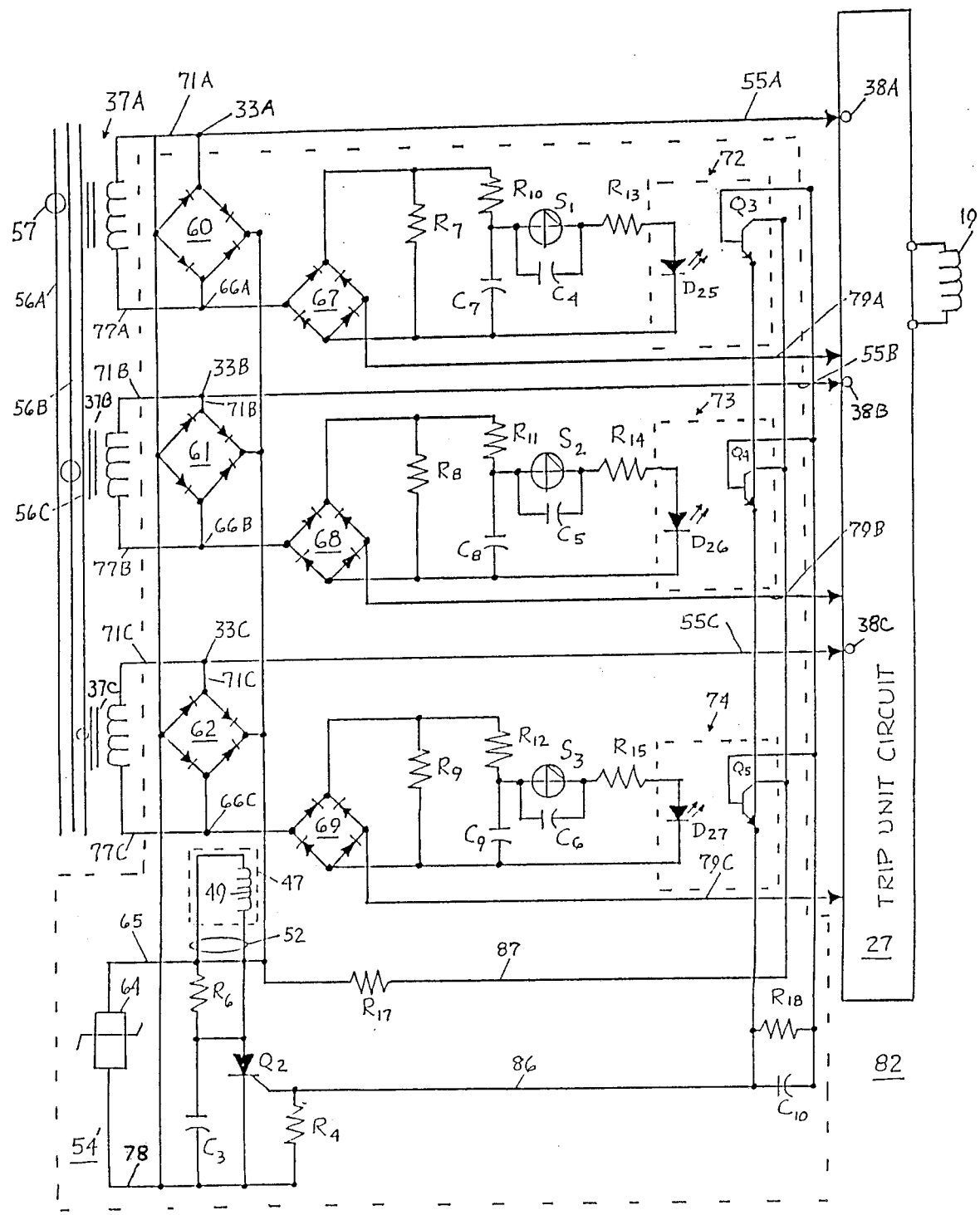
FIG. 6 is a further embodiment of the circuit depicted in FIG. 4.

An alternate arrangement of the electronics within the circuit breaker of FIG. 1 is depicted at 82 in FIG. 6 and is similar to that described earlier with respect to FIG. 5 and similar reference numerals will be used for similar components where possible. The trip actuator circuit 54′ is connected with the current transformers 37A–37C by means of conductors 71A–71C and conductors 77A–77C respectively. The bridge rectifiers 60–62 connect with the trip unit circuit 27 through transformer pins 33A–33C, trip unit pins 38A–38C, 66A–66C and conductors 55A–55C, 79A–79C. The silicon switches $S_1$–$S_3$, burden resistors $R_7$–$R_9$, resistors $R_{10}$–$R_{12}$ and capacitors $C_4$–$C_9$ perform in the manner similar to that described earlier with reference to FIG. 5. The auxiliary trip coil 49 within the auxiliary trip actuator 47 connects with the trip actuator circuit 54′ by means of the two-conductor cable 52 and the varistor 64 connects across the positive and negative rails 65, 78 as earlier described. The trip actuator circuit differs from that described within FIG. 5 by the inclusion of three opto-isolators 72–74 which connect with the thyristor $Q_2$ over conductor 86 as indicated. The silicon switches $S_1$–$S_3$ connect with the photo-diodes $D_{25}$–$D_{27}$ within the opto-isolators through current limiting resistors $R_{13}$–$R_{15}$. The respective emitters of the photo-transistors $Q_3$–$Q_5$ are connected together and to the gate of the thyristor $Q_2$ to trigger the thyristor to its "ON" state when the current through the power conductors 56A–56C exceed a predetermined value. The collectors of the photo-transistors are connected together and to the positive rail 65 by means of current limiting resistor $R_{17}$ and conductor 87. The bases of the phototransistors are connected together and to their emitters by means of capacitor $C_{10}$ and resistor $R_{18}$ as indicated. The trip actuator coil 19 functions in the manner described earlier to articulate circuit breaker operating mechanism upon receipt of energizing current supplied by the trip unit circuit 27. The auxiliary trip coil 49 articulates the circuit breaker operating mechanism upon the occurrence of overcurrent conditions in excess of a predetermined value by operation of the silicon switches $S_1$-$S_3$ and thyristor $Q_2$ to supply operating current directly from the current transformers 37A-37C. The optoisolators 72-74 serve to electrically isolate the current transformers 37A-37C within the individual phases of the three-phase conductors 56A-56C.

Figure 7:
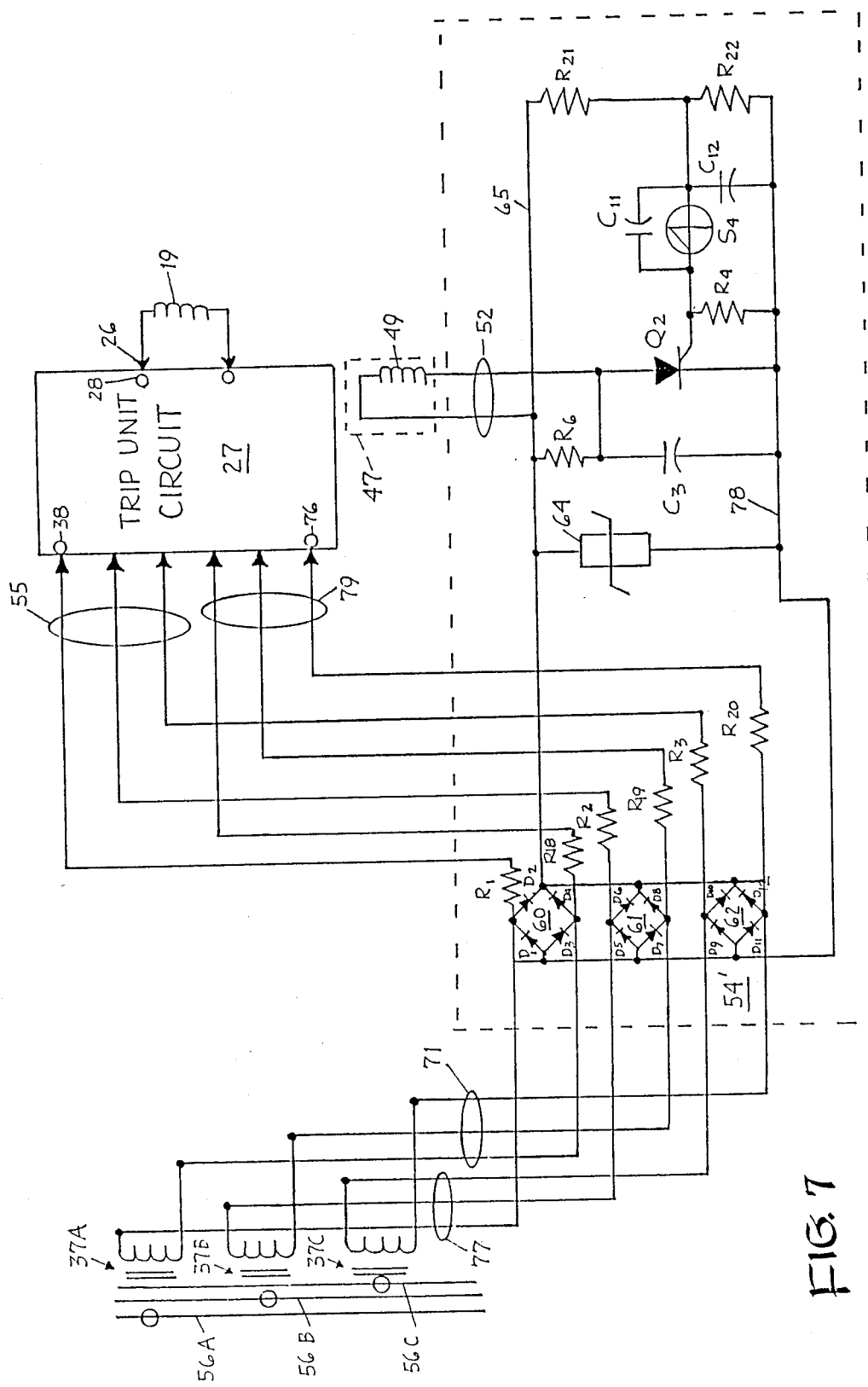
FIG. 7 is an additional embodiment of the circuits depicted in FIG. 4.

The circuit electronics arrangement depicted at 83 in FIG. 7 operates in a manner similar to that described earlier with reference to FIG. 4 and similar reference numerals will be used to indicate similar circuit components where possible. The trip actuator circuit 54' connects with the phase conductors 56A-56C through current transformers 37A-37C and the three-conductor cables 71, 77 as indicated. The cable conductors provide input to the bridge rectifiers 60-62 comprising diodes $D_1$-$D_{12}$, the outputs of which are connected to the positive and negative rails 65, 78 respectively. The trip actuator circuit connects with the trip unit circuit 27 by means of the three-conductor cables 55, 79 and pin connectors 38 and 76. The actuator-accessory coil 19 connects with the trip unit circuit 27 by means of pins 28 and connectors 26. The auxiliary trip coil 49 within the auxiliary trip actuator 47 connects with the trip actuator circuit 54' by means of the two-conductor cable 52. Current limiting resistors $R_1$-$R_3$ and $R_{18}$-$R_{20}$ serve to provide input voltage to the trip actuator circuit for overcurrent determination. The varistor 64 serves to clamp the positive and negative rails 65, 78 against voltage conditions that occur upon short circuit overcurrent conditions. The circuit differs from that described with reference to FIG. 4 in that the actuator-accessory coil 19 articulates the circuit breaker operating mechanism upon receipt of signals generated by the trip unit circuit 27 upon the occurrence of overcurrent conditions up to a predetermined level. The trip actuator circuit 54' operates independently of the actuator-accessory coil to articulate the circuit breaker operating mechanism by energizing the auxiliary trip coil 49 upon occurrence of an overcurrent condition in excess of the predetermined amount. The operation of the trip actuator circuit 54' is set by means of the voltage divider consisting of resistors $R_{21}$ and $R_{22}$ connected across the positive and negative rails 65, 78. When a fault occurs within any of the power conductors 56A-56C a voltage is generated across the voltage divider causing the voltage across $C_{12}$ to exceed the threshold voltage of the silicon switch $S_4$ which in turn becomes conductive causing the capacitor $C_{12}$ to discharge into resistor $R_4$ and triggering thyristor $Q_2$ into conduction. Current thereby transfers from the current transformers through the trip actuator coil 49, which in turn, articulates the circuit breaker operating mechanism to interrupt the circuit current. As described earlier, resistors $R_1$-$R_3$ and $R_{18}$-$R_{20}$ function to increase the current transformer voltage, while dividing the current transformer current between the trip unit circuit 27 and the auxiliary trip coil 49 once the trip coil becomes energized. Capacitor $C_{11}$ serves to prevent the silicon switch from becoming conductive due to spurious voltage signals while resistor $R_6$ serves to provide latching current to $Q_2$ as earlier described with respect to the circuit configuration depicted in FIG. 4.

There has herein been described several circuits for controlling the operation of dual trip coils in the form of a low overcurrent actuator-accessory coil and a larger overcurrent auxiliary trip coil. One of the circuits described herein utilizes the actuator-accessory coil in combination with the auxiliary trip coil to provide overcurrent circuit protection over a wide range of overcurrent values. A separate pair of circuits provide low overcurrent protection by operation of the trip unit circuit with the actuator-accessory coil while simultaneously providing higher overcurrent protection by means of the auxiliary trip coil and the trip actuator circuit, independent of the actuator-accessory coil.

Having thus described our invention, what we claim as new and desire to secure by Letters Patent is:

1. A circuit interrupter comprising:
    a case and a cover;
    a pair of separable contacts within said case under control of an operating mechanism;
    an electronic trip circuit within said cover connected with a first trip coil to articulate said operating mechanism and separate said contacts upon occurrence of first overcurrent conditions through said contacts; and
    a second trip coil connected to said first trip coil to articulate said operating mechanism and separate said contacts upon occurrence of second overcurrent conditions through said contacts.

2. The circuit interrupter of claim 1 wherein said first trip coil is connected to said second trip coil through a control circuit.

3. The circuit interrupter of claim 1 wherein said first trip coil is arranged within said cover and said second trip coil is arranged within said case.

4. The circuit interrupter of claim 2 wherein said control circuit includes a transformer having a primary winding connected with said first trip coil.

5. The circuit interrupter of claim 4 wherein said control circuit further includes an electronic switch connected with a secondary winding of said transformer.

6. The circuit interrupter of claim 5 wherein said electronic switch comprises a thyristor, a gate of said thyristor being connected with said transformer secondary winding and an anode of said thyristor being connected with said second trip coil.

7. The circuit interrupter of claim 5 including a second electronic switch connected with said secondary winding and said electronic switch.

8. The circuit interrupter of claim 7 wherein said second electronic switch comprises a second thyristor, a gate of said second thyristor being connected with said secondary winding and a cathode of said second thyristor being connected with said gate of said thyristor.

9. The circuit interrupter of claim 4 wherein said transformer comprises a pulse transformer.

10. The circuit interrupter of claim 2 wherein said control circuit includes a plurality of silicon switches connected with said second trip coil through a transformer having a plurality of primary windings.

11. The circuit interrupter of claim 10 wherein a secondary winding on said transformer connects with said second trip coil through an electronic switch.

12. The circuit interrupter of claim 11 wherein said electronic switch comprises a thyristor, a gate of said thyristor being connected with said transformer secondary winding and an anode of said thyristor being connected with said second trip coil.

13. The circuit interrupter of claim 11 wherein said control circuit further includes a plurality of rectifiers having input and output terminals, said input terminals being connected with current-sensing transformers and with said electronic trip circuit, said output terminals being connected with said silicon switches and said primary windings.

14. The circuit interrupter of claim 13 further including an RC timing circuit connected to each of said silicon switches for preventing spurious turn-on of said silicon switches.

15. The circuit interrupter of claim 2 wherein said control circuit includes a plurality of silicon switches connecting with said second trip coil through a corresponding plurality of opto-isolators.

16. The circuit interrupter of claim 15 wherein said control circuit includes a plurality of rectifiers having input and output terminals, said input terminals connecting with current-sensing transformers and said electronic trip unit, said output terminals connecting with said silicon switches and said opto-isolators.

17. The circuit interrupter of claim 16 wherein said opto-isolators include photodiodes connecting with said silicon switches and photo-transistors connecting with said second trip coil.

18. The circuit interrupter of claim 17 including an electronic switch connecting between said photo-transistors and said second trip coil.

19. The circuit interrupter of claim 18 wherein said electronic switch comprises a thyristor, a gate of said thyristor being connected with emitters of said photo-transistors, an anode of said thyristor being connected with said second trip coil.

20. The circuit interrupter of claim 2 wherein said control circuit includes a plurality of rectifiers connected with a corresponding plurality of current-sensing transformers and with said electronic trip circuit and an electronic switch connecting with said second trip coil and said rectifiers.

21. The circuit interrupter of claim 20 wherein said electronic switch comprises a thyristor, an anode on said thyristor connecting with said second trip coil and a cathode on said thyristor connecting with said rectifiers.

22. The circuit interrupter of claim 21 further including a silicon switch connecting between said thyristor gate and a midpoint between a pair of resistors connected together as a voltage divider.

23. The circuit interrupter of claim 20 wherein said rectifiers connect with said electronic trip unit through corresponding current limiting resistors.

* * * * *